United States Patent
Büttgen et al.

(10) Patent No.: US 7,923,673 B2
(45) Date of Patent: Apr. 12, 2011

(54) LARGE-AREA PIXEL FOR USE IN AN IMAGE SENSOR

(75) Inventors: Bernhard Büttgen, Adliswil (CH); Felix Lustenberger, Cham (CH); Peter Seitz, Urdorf (CH)

(73) Assignee: MESA Imaging AG, Zurich (CH)

( * ) Notice: Subject to any disclaimer, the term of this patent is extended or adjusted under 35 U.S.C. 154(b) by 417 days.

(21) Appl. No.: 11/659,314

(22) PCT Filed: Jul. 18, 2005

(86) PCT No.: PCT/CH2005/000417
§ 371 (c)(1),
(2), (4) Date: Oct. 20, 2008

(87) PCT Pub. No.: WO2006/012761
PCT Pub. Date: Feb. 9, 2006

(65) Prior Publication Data
US 2009/0212197 A1    Aug. 27, 2009

(30) Foreign Application Priority Data
Aug. 4, 2004   (EP) .................................... 04405489

(51) Int. Cl.
*H01L 27/00* (2006.01)
(52) U.S. Cl. .................. 250/208.1; 250/214.1; 257/292; 257/448; 348/298
(58) Field of Classification Search ............... 250/208.1, 250/214.1; 257/290–293, 431, 443, 448; 348/294, 298, 313
See application file for complete search history.

(56) References Cited

U.S. PATENT DOCUMENTS

| | | | |
|---|---|---|---|
| 4,245,233 A | 1/1981 | Lohstroh | |
| 4,709,381 A | 11/1987 | Beaudet | |
| 4,788,581 A | 11/1988 | Knoll et al. | |
| 4,896,200 A | 1/1990 | Seki et al. | |
| 5,317,174 A | 5/1994 | Hynecek | |
| 5,528,643 A | 6/1996 | Hynecek | |

(Continued)

FOREIGN PATENT DOCUMENTS

DE         35 07 763 A1    9/1986

(Continued)

OTHER PUBLICATIONS

International Search Report from International Application No. PCT/CH2005/000417, filed Jul. 18, 2005, mailed on Nov. 14, 2005.

(Continued)

*Primary Examiner* — Kevin Pyo
(74) *Attorney, Agent, or Firm* — Houston Eliseeva, LLP

(57) ABSTRACT

A pixel for detecting incident radiation (In) over a large area with high sensitivity and low power consumption. The pixel comprises a semiconductor substrate (1), covered by a thin insulating layer (2), on top of which a dendritic or arborescent gate structure (3) is arranged. The dendritic gate (3) is electrically connected at two or more contacts (C1, C2) with voltage sources, leading to the flow of a current and a position-dependent potential distribution in the gate (3). Due to the use of arborescent structures and various materials (31, 32), the pixel can be optimized for a certain application, in particular in terms of the electric field distribution, the RC time constant, the power consumption and the spectral sensitivity. Due to its compact size, the photo sensor can be arranged in linear or two-dimensional manner for the realization of line and area sensors.

25 Claims, 7 Drawing Sheets

U.S. PATENT DOCUMENTS

| | | | |
|---|---|---|---|
| 5,856,667 | A | 1/1999 | Spirig et al. |
| 6,777,659 | B1 | 8/2004 | Schwarte |
| 2009/0026508 | A1* | 1/2009 | Seitz .......................... 257/292 |

FOREIGN PATENT DOCUMENTS

| | | |
|---|---|---|
| DE | 44 40 613 | 7/1996 |
| DE | 19704496 A1 | 3/1998 |
| DE | 198 21 974 | 11/1999 |
| EP | 0651448 A1 | 5/1995 |
| EP | 1 152 261 | 4/2000 |
| FR | 2752299 A1 | 2/1998 |
| GB | 2389960 A | 12/2003 |
| WO | 99/60629 A1 | 11/1999 |
| WO | 03/005454 A2 | 1/2003 |

OTHER PUBLICATIONS

European Search Report from Application No. EP 04 405 489.8, filed Aug. 4, 2004, dated Oct. 11, 2006.

Hoffman, K., "Surface Charge Transport with an MOS-Transmission-Line," Solid-State Electronics, vol. 20, 1977, pp. 177-181.

Lattes, A. L. et al., "Ultrafast Shallow-Buried-Channel CCD's with Built-in Drift Fields," IEEE Electron Device Letters, vol. 12, No. 3, Mar. 1991, pp. 104-107.

Seitz, P. et al., "Smart optical and image sensors fabricated with industrial CMOS/CCD semicinductor processes," SPIE vol. 1900, 1993, pp. 21-30.

Seitz, P., "Solid-State Image Sensing," in Computer Vision and Applications—A Guide for Students and Practitioners (Jaehne, B. et al., ed.), Academic Press, San Diego, 2000, pp. 167-222.

Seitz, P., "Solid-State Image Sensing," in Computer Vision and Application—A Guide for Students and Practitioners (Jaehne, B. et al., ed), Academic Press, San Diego, 2000, pp. 46-84.

Biber, A. et al., "Avalanche photodiode image sensor in standard silicon BiCMOS technology," Sensors and Actuators, vol. A 90, 2001, pp. 82-88.

Engelhardt, K. et al., "Absolute, high-resolution optical position encoder," Applied optics, vol. 35, No. 1, Jan. 1996, pp. 201-208.

Hynecek, J., "BCMD—A New Photosite Concept for Advanced Image Sensors," Optoelectronics—Devices and Technologies, vol. 6, No. 2, Dec. 1991, pp. 245-260.

Seitz, P., "Smart Pixels," Proceedings EDMO 2001, pp. 229-234.

Theuwissen, A. J. P., "Solid-state imaging with charge-coupled devices," Kluwer, Dordecht, 1995, pp. 7-51.

* cited by examiner

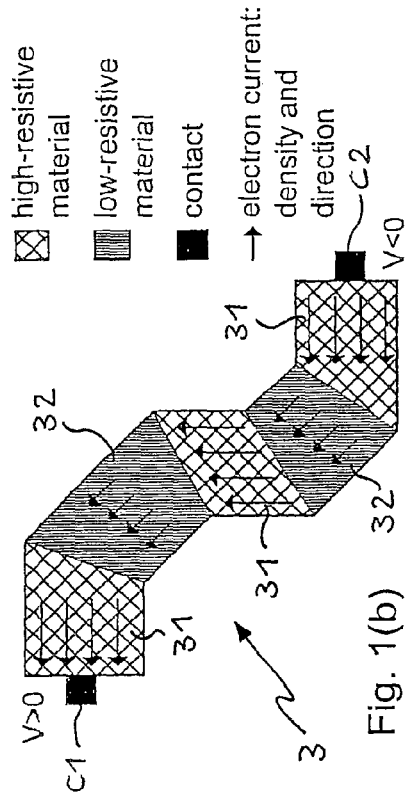
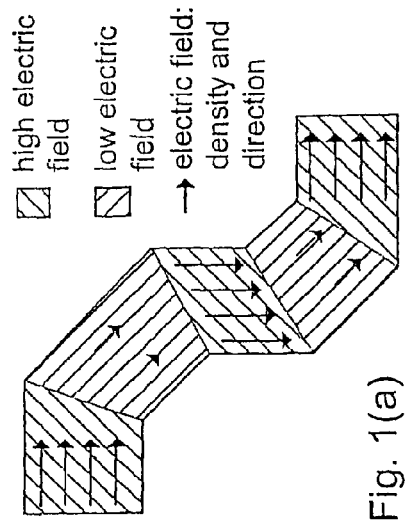
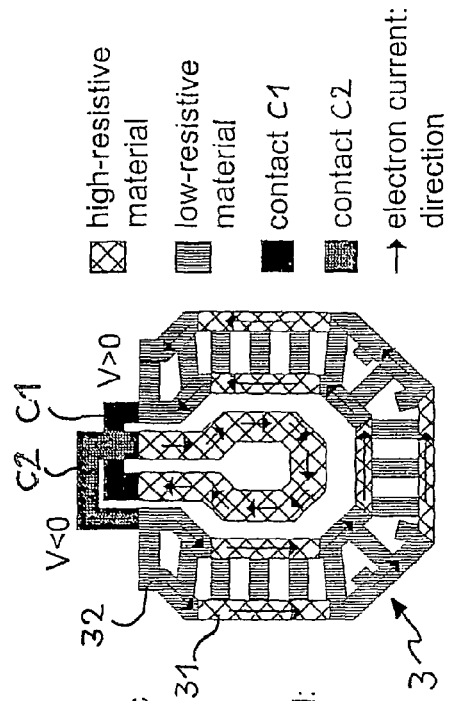
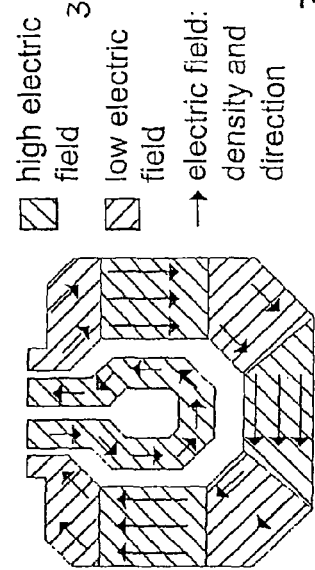
Fig. 1(a)
Fig. 1(b)
Fig. 2(a)
Fig. 2(b)

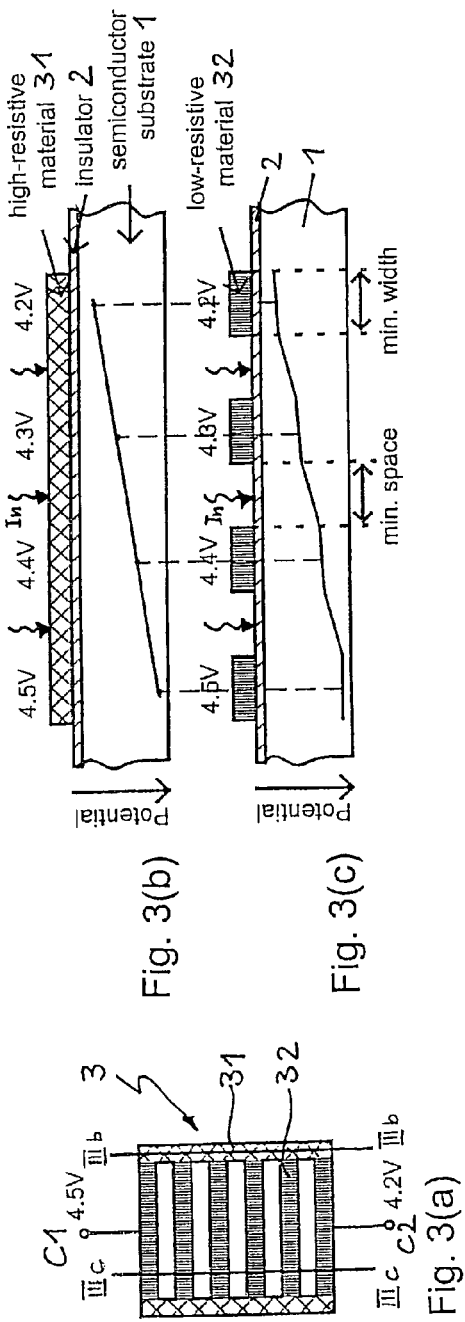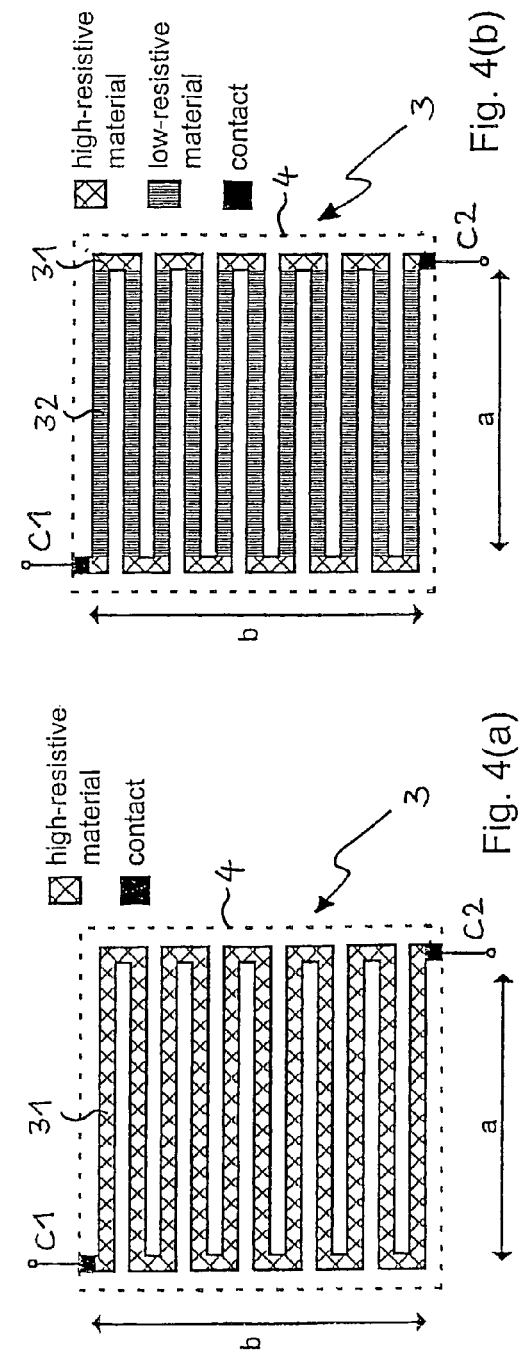

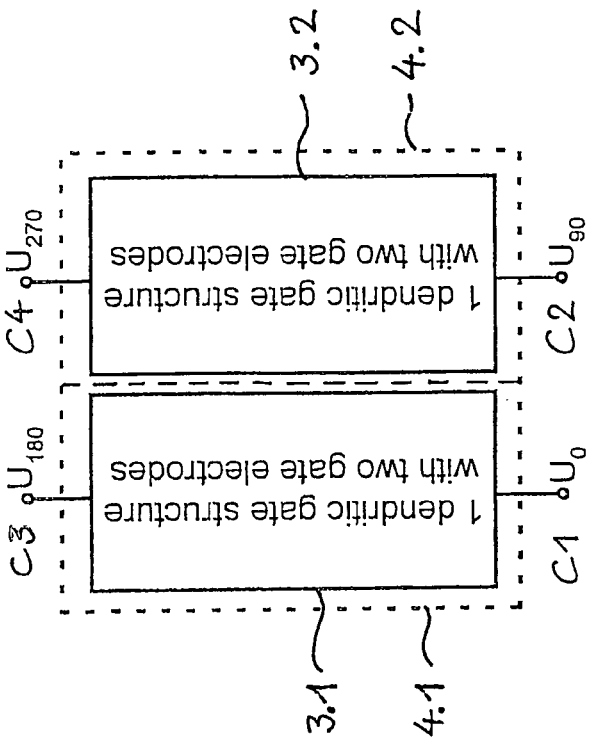
Fig. 8
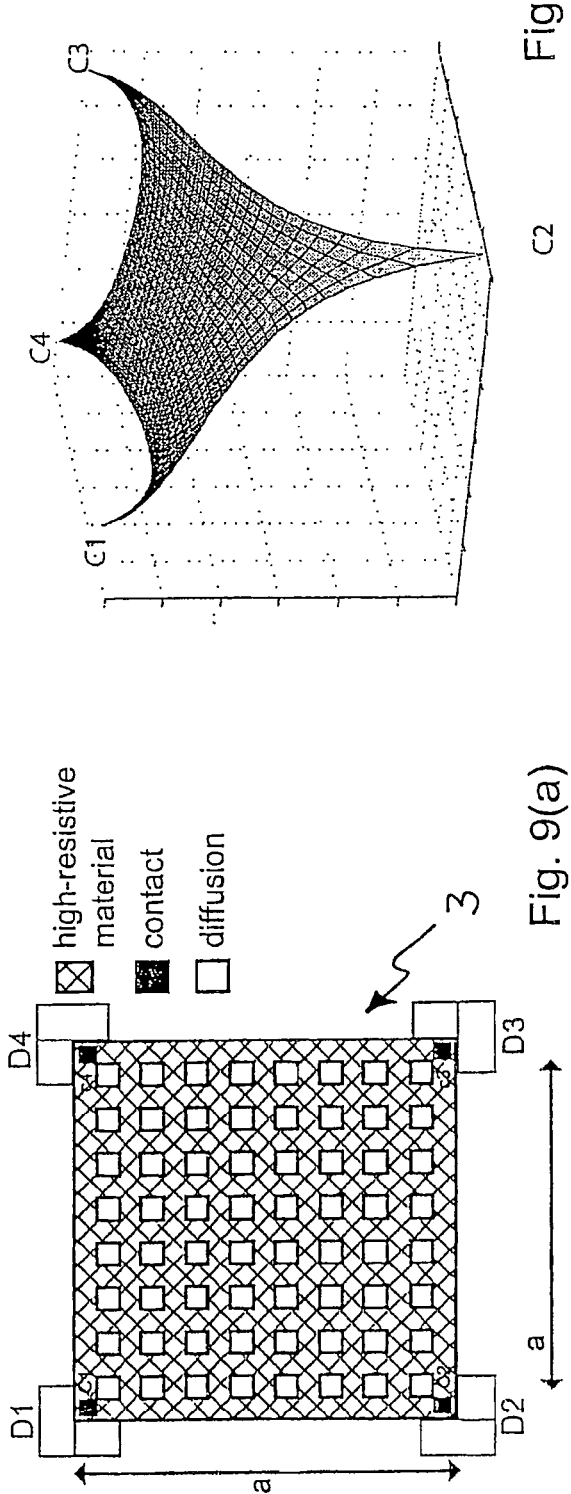
Fig. 9(a)
Fig. 9(b)

LARGE-AREA PIXEL FOR USE IN AN IMAGE SENSOR

This application is a §371 national phase filing of PCT/CH2005/000417 filed Jul. 18, 2005, and claims priority to European application No. 04 405489.8 filed Aug. 4, 2004.

FIELD OF THE INVENTION

The present invention relates to all solid-state sensing and measuring techniques requiring the local detection of electromagnetic or particle radiation, preferably electromagnetic radiation in the ultraviolet, visible or infrared spectral range, while satisfying simultaneously the following constraints: large sensing area of more than 10 square micrometers, high quantum efficiency and photo-charge sensitivity, low power consumption, as well as the capability to demodulate incident modulated radiation.

This invention further relates to all photo-sensing and particle-sensing applications in which it is difficult to focus the incident radiation with optical means, such as X-ray, gamma-ray, deep-UV or atom-beam imaging.

This invention also relates to all optical distance measurement techniques based on optical phase-shifting interferometry or on time-of-flight ranging, requiring the local determination of the modulation parameters of incident, temporally modulated radiation.

The present invention relates in particular to all of these sensing and measurement techniques that require dense one- or two-dimensional arrays of functional pixels.

BACKGROUND OF THE INVENTION

The image-sensor picture elements (pixels) known from literature are either of the photodiode or the MOS device type, as described for example in P. Seitz, "Solid-State Image Sensing", in *Computer Vision and Applications—A Guide for Students and Practitioners* (B. Jähne and H. Haussecker, Eds.), pp. 111-152, Academic Press, San Diego, 2000. In such photo sensors, the photo-charge detection sensitivity varies with the inverse of the total capacitance of the pixel. This capacitance, on the other hand, increases monotonously (for larger pixels almost linearly) with the pixel size. For this reason, it is not possible to realize such conventional photo sensors that are at the same time very large and highly sensitive.

A first method that allows the realization of two-dimensional arrays of large-area and highly sensitive pixels is described by P. Seitz et al. in "Smart optical and image sensors fabricated with industrial CMOS/CCD semiconductor processes", *Proc. SPIE*, Vol. 1900, 21-30, 1993. The so-called "charge binning" method makes use of standard CCD technology and employs a special charge transport/accumulation technique. The CCD gates are clocked such that charge packets from different pixels are accumulated under one gate, so that this summed charge can be read out instead of reading out all pixel charge packets individually. In a two-dimensional CCD image sensor it is possible to employ this charge binning method to realize two-dimensional areas of an effective photosensitive size ("super pixels") that are much larger than the areas of individual pixels, and these super pixels can even have non-rectangular shape. However, this implies the use of industry standard CCD technology for the fabrication of CCD image sensors, as well as suitable CCD clocking circuitry and schemes with the associated system complexity and high electrical power consumption. The charge transport process within the semiconductor bulk material that is typical for CCD structures, is primarily based on slow diffusion processes instead of fast drift processes, hence significantly limiting the response time.

U.S. Pat. No. 5,528,643 (J. Hynecek: "Charge coupled device/charge super sweep image system and method for making") describes the fast lateral transport of photo-generated charge carriers by employing a series of CCD gates, each of which has contacts at both ends at which voltage differences can be applied. In this way, each CCD electrode exhibits a lateral drift field at the semiconductor-insulator interface. Thus, a two-dimensional CCD image sensor with improved photo-charge transport speed in the column and read-out line directions is created. As in the charge binning approach described above, this architecture necessitates CCD clocking circuitry and clocking schemes. Again, system complexity and power consumption will be rather high. Furthermore, no demodulation action for an incident modulated wave field can be obtained with such a device, since photo-charge can only be moved in one fixed direction.

A second method to overcome the contradiction of simultaneous implementation of large sensitive area and small conversion capacity is based on the idea of K. Hoffmann (*Solid State Electronics*, Vol. 20, 1977). Charge carriers are transported by drift fields rather than by a diffusion process over a large area with subsequent storage in a diffusion node with small conversion capacity. This fast and efficient charge-transport method was used first by K. Hoffmann in memory cells. J. Lohstroh proposed in U.S. Pat. No. 4,245,233 (Lohstroh: "Photosensitive device arrangement using a drift field charge transfer mechanism") the exploitation of the method for the collection of photo-generated charges. An elongated one-dimensional MOS structure is described, consisting of a highly resistive layer on top of an insulator covering a semiconductor. A voltage difference is applied to the two ends of the highly resistive layer, creating in the corresponding spatial dimension a linearly increasing potential distribution at the interface between semiconductor and insulator. Charges are generated by incident radiation in the bulk of the semiconductor, and they move to the semiconductor-oxide interface essentially by diffusion. Once they are close to the semiconductor-oxide interface, they feel the spatially varying surface potential, and they move along the electric field lines to the region with lowest potential energy, at one end of the device. At this place, a diffusion implant at the semiconductor surface is employed to extract the photocurrent, making use of a transimpedance circuit that keeps the diffusion at a fixed potential. Since this type of photosensor makes use of one-dimensional elongated structures and a transimpedance circuit, the complete device covers a large area. Therefore, it is practically only useful for single photo-detector sites or, at most, for a linear array of photodetector pixels that offer at the same time large areas and high charge detection sensitivity.

DE-44'40'613 C1 (Spirig, Seitz: "Vorrichtung und Verfahren zur Detektion und Demodulation eines intensitätsmodulierten Strahlungsfeldes") teaches the detection and demodulation of intensity modulated wave fields with sensing elements that consist of three parts: one photosensitive part, in which incident photons are converted into a proportional number of electronic charge pairs, one or more storage elements, into which the photo-generated charges are stored and accumulated, and an equal number of switches between the photosensitive part and each storage element. The switches are operated synchronously with the modulation frequency. A preferred embodiment relies on charge coupled device (CCD) techniques, as described by A. J. P. Theuwissen in "Solid-state imaging with charge-coupled devices", Kluwer, Dordrecht, 1995. There, the photosensitive site and the switches are realized and operated by CCD gates that enable the transport of the photo-generated charge laterally. Though the photo-sensitive area and the conversion capacity have been decoupled, allowing the combination of large area sensing and high sensitivity, the disadvantages of this approach include the limited demodulation speed that is obtained with CCDs, especially if large photosensitive sites and CCD gates are employed. Further disadvantages are the necessity of special semiconductor processes for the fabrication of the CCD structures, and the demands on clocking waveforms with specially shaped rising or falling edges in order to obtain high charge-transfer efficiency under the CCD gates. An alternate embodiment of the switches employs field effect transistors (FETs), as available in industry standard complementary metal oxide semiconductor (CMOS) processes. This type of switch is simpler to operate, and it is readily fabricated. The disadvantage of the FET switch is increased charge and voltage noise behavior due to incomplete charge transfer, charge injection effects and channel current noise caused by gate voltage fluctuations.

DE-198'21'974 A1 (Schwarte: "Vorrichtung und Verfahren zur Erfassung von Phase und Amplitude elektromagnetischer Wellen") overcomes the speed limitations of large photosensitive elements by replacing the single large photo gate with a comb-like structure of interdigitated finger-electrode photo gates. The photo-generated charge carriers are therefore more rapidly collected, and they can also be transferred more quickly onto two or more storage elements. The teaching relies also on switching elements for transferring photo charge onto suitable storage elements. The disadvantages of these switching elements, realized as CCD gates of FETs, are the same as described for DE-44'40'613 C1.

EP-1'152'261 A1 (Lange, Seitz: "Device and method for spatially resolved photodetection and demodulation of modulated electromagnetic waves") describes an alternative sensing element for the detection and demodulation of intensity-modulated wave fields. It employs two photo-sensing parts per sensing element, each with two storage sites and an associated switching element. When used in conjunction with a diffusing optical component on top of the sensing element for the equal distribution of the incoming wave field intensity on the two photo sites, this device allows prolonged integration times and relieves the timing restrictions on the clock waveform. The number of storage sites is limited to four, rendering this device ineffective if more than four samples per period of the modulated waveform should be taken. Since the teaching also relies on switches for the transfer of photo charges from the photo sites to the storage elements, the same disadvantages are encountered as described for the above two documents.

The basic photodiode and MOS device types and the enhanced pixel structures with separate photo-charge collection area and photo-charge storage and detection devices mentioned above have the disadvantage of one-dimensional pixel topology. As a direct consequence, in movements of photo-generated charges effectuated by drift fields, for example within the space charge region of a photodiode or between MOS devices (both with or without overlapping gate electrodes), there is very little control over the two-dimensional distribution of the electric field and, consequently, over the motion of the photo-charges. In addition, some of the pixel structures described above exhibit high power dissipation and/or low quantum efficiency. No known pixel device is capable of combining large-area sensing with high conversion gain, high quantum efficiency and in particular a two-dimensional spatial influence on the transport of the photo-generated charges by an optimized electric field distribution that can be fully controlled in the two lateral dimensions.

SUMMARY OF THE INVENTION

It is an object of the invention to provide a pixel for use in a solid-state image sensor and a method for sensing incident radiation which make possible the full control over the two-dimensional lateral electric field in the semiconductor, allowing the optimized, application-specific collection and accumulation of photo-generated charge carriers with minimum electrical power consumption in a given semiconductor technology. The pixel and the method shall allow for sensing of electromagnetic radiation, preferably in the ultraviolet, visible or infrared spectral range, or particle radiation. The pixel shall simultaneously meet the following requirements: large sensing area of more than 10 square micrometers, high quantum efficiency, high photo-charge sensitivity and low power consumption.

A further object of the invention is to provide a solid-state pixel and a sensing method that are able, in addition to the above capabilities, to demodulate incident modulated radiation, in particular at high modulation frequencies above 1 MHz.

These and other objects are solved by the detector pixel and the detecting method as defined in the independent claims. Advantageous embodiments are defined in the dependent claims.

The invention is based on the idea of geometrically and electrically separating the two main tasks of a detector pixel: firstly, the conversion of incident radiation into photo-generated charge pairs, including their collection and accumulation; and secondly, the electronic detection of the accumulated photo charges with very high sensitivity.

The pixel according to the invention comprises a semiconductor substrate, covered by a thin insulating layer with a thickness of 1 nm to 500 nm, on top of which a dendritic or arborescent gate structure is fabricated. The dendritic gate is characterized by an arborescent shape, whose topology is two-dimensional, in contrast to the conventional one-dimensional topologies. More than one material can be used for one dendritic gate, such as, but not limited to, high-resistive polysilicon, low-resistive polysilicon and metal. The dendritic gate is electrically connected at two or more contacts with voltage sources, through which a flow of current is produced through the gate. This leads to a position-dependent potential distribution in the gate, which is reproduced at the insulator-semiconductor interface. The associated lateral electric field is employed for the efficient, high-speed transport of photo-generated charge carriers. The charge carriers are collected and accumulated either below so-called integration gates adjacent to the dendritic gate electrode or in diffusion wells that are produced in the semiconductor at the edges of the dendritic gate structure, close to the contact points. Collection of photo-generated charge carriers takes place below the integration gates or in the diffusion wells whose neighboring contacts have maximum potential in the case of photoelectrons, or minimum potential for photo-generated holes, respectively.

More specifically, the pixel according to the invention is formed in a semiconductor substrate with a plane surface for use in an image sensor. It comprises an active region for converting incident radiation into charge carriers of a first and a second charge type, separating the charge carriers of the first charge type from the charge carriers of the second charge type and accumulating charge carriers of at least one charge type. The pixel further comprises a detection region for electronically detecting the accumulated charge carriers, the detection region being geometrically and electrically separated from the active region. The active region has field-generating means for generating a lateral electric drift field at the semiconductor surface in the active region, the field-generating means comprising a resistive electrode layer isolated from the semiconductor substrate and at least two connections for applying an electric potential difference along the electrode layer. The electrode layer has a dendritic or arborescent shape.

The image sensor according to the invention comprises a plurality of pixels arranged in a one- or two-dimensional array, the pixels being pixels according to the invention as defined above.

The method for sensing incident radiation according to the invention comprises the steps of:
converting the incident radiation into charge carriers of a first and a second charge type in an active region of a pixel formed in a semiconductor substrate with a plane surface,
generating a lateral electric drift field at the semiconductor surface in the active region,
separating the charge carriers of the first charge type from the charge carriers of the second charge type by means of the drift field,
accumulating charge carriers of at least one charge type, and
electronically detecting the accumulated charge carriers in a detection region which is geometrically and electrically separated from the active region.

The drift field is generated by providing in the active region a resistive electrode layer isolated from the semiconductor substrate, the electrode layer being designed to have a dendritic or arborescent shape, and applying an electric potential difference along the electrode layer.

Due to the use of dendritic or arborescent gate structures, the two-dimensional topology and the possible use of various materials (e.g., high/low-resistive polysilicon and metal), the pixel according to the invention can be optimized for a certain application. In particular, the optimization may refer to the detailed two-dimensional potential distribution, the effective RC time constant of the gate seen by the electronic driving circuit, the power dissipation in the gate and the required driving circuit, as well as the spectral sensitivity.

Because of its compact size, the pixel can be arranged in linear or two-dimensional fashion for the realization of line or area image sensors. Since the pixel can be fabricated with industry standard semiconductor processing steps, it is compatible with commercially available complementary metal oxide semiconductor (CMOS) and charge-coupled device (CCD) processes, and it can be combined with active-pixel sensor (APS) and CCD functionality.

The invention overcomes the prior-art disadvantages by providing a pixel for one-dimensional and two-dimensional image sensors that offer at the same time a large photosensitive area and a large photo-charge detection sensitivity, requiring a power consumption that may be two orders of magnitude lower than with known techniques. When used for demodulation purposes, the pixel according to the present invention makes it possible to realize the optimum compromise between modulation/demodulation frequency, response speed due to the RC time constant of the dendritic gate, and the total power consumption of the gate and its associated electronic driving circuit.

The new concept of the pixel architecture allows creating any two-dimensional controllable distribution of the electric field in the semiconductor material so that a spatially dependent and controlled transport of photo-generated charges within the semiconductor can be realized. The electric field can be adjusted in direction as well as in magnitude.

The technique of combining different materials having an arborescent structure enables an optimal adjustment of electric parameters such as the RC time constant, power consumption, etc. The RC time constant is a measure for how fast a passive electronic circuit, consisting predominantly of resistive and capacitive parts, follows the voltage of an external voltage source. Depending on the application, a high RC time constant can be desired to be able to sweep a voltage pulse over the entire gate area, similar to U.S. Pat. No. 5,528,643 but without complex clocking schemes and circuitry and with the possibility of charge transport in opposite direction.

The dendritic gate pixel can be operated either in static or in dynamic mode. In the static mode, constant voltages are applied to the gate contacts during the integration period. This mode is very suitable for conventional image sensing. If large sensitive areas are desired, a sensor with high photosensitivity for low-light environments can be realized. Furthermore, the combination of a large photosensitive area and a small conversion capacity is very useful for the highly sensitive detection of low-intensity electromagnetic or particle radiation fields that are difficult to focus with optical means, e.g., for X-ray imaging applications.

The dynamic mode of operation enables the demodulation of incident modulated radiation. It is particularly useful for time-of-flight distance measurements, but also for other time-dependent applications such as the measurement of decaying processes as encountered in fluorescent imaging or Raman scattering. This operation mode requires a time-dependent variation of the gate voltages. In general, a pixel for time-dependent measurements requires more than one integration node. The possibility of designing large sensitive areas and adaptively controlling the electric drift fields at high speed allows for high modulation/demodulation frequencies and highly sensitive time-of-flight pixels. This implies that dendritic pixels in combination with appropriate readout structures such as logarithmic compression or specific clocking schemes, such as the use of several non-destructive readout events, enable time-of-flight pixels with high distance resolution and high dynamic range.

As an example, the specific application of time-of-flight distance measurement using the novel pixel architecture is described in the following. By time-of-flight measurement one understands to measure the time required for light to travel from a camera to a remote object and back to the camera. This time is proportional to the distance between the camera and the object. The distance can be calculated using the known finite speed of light. In order to extract the distance information from a light signal in each pixel, one could, among other methods, modulate the incident light temporally with a given frequency f, thus exhibiting a period of T=1/f. For the operation of the dendritic gate pixel as a demodulation device, the period T is divided into two or more time intervals. For each time interval, a different voltage configuration is generated at the electrode contacts by a suitable electronic timing circuit, employing for example a field-programmable gate array (FPGA). Each voltage configuration has the property that a different electrode contact receives the highest potential. During each time interval, photo-generated charge carriers are moved to the corresponding storage diffusion where they are accumulated and stored. The sequence of operations described above can be repeated over many periods, i.e., during a long total exposure time, before the photo-charge carriers accumulated in the storage regions are electronically read out. This permits to increase the number of detected photoelectrons, and hence to increase the corresponding signal-to-noise ratio by temporally averaging the sought signal. The result of the operation described above consists of two or more electrical signal values, one for each storage-diffusion site. These signal values are then used to calculate the modulation parameters, in particular the phase information as a direct measure of the distance to an object.

As an example, two signal values A0 and A1 of a modulated wave field sampled at times that differ by half of the modulation period T, allow the calculation of the phase P and the amplitude A of a sinusoidal intensity-modulated and offset-free incident wave field by the equations $$A=(A0+A1)/2$$

$$P=\arcsin[(A0-A1)/(A0+A1)]$$

Extending the example to four signal values requires in practice a dendritic gate pixel with four gate contacts and storage nodes and an appropriate clocking scheme for the electrode voltages in order to obtain four sample values A0, A1, A2 and A3 of the incident modulated wave field. Generally the samples are the result of the integration of photo-generated charge carriers over many quarters of the modulation period, whereby finally each sample corresponds to a multiple of one quarter of the modulation period. The phase shift between two subsequent samples is 90°. Using these four samples, the three decisive modulation parameters amplitude A, offset B and phase shift P of the modulation signal can be extracted by the equations $$A=\sqrt{[(A3-A1)^2+(A2-A1)^2]}/2$$

$$B=[A0+A1+A2+A3]/4$$

$$P=\arctan[(A3-A1)/(A0-A2)].$$

In any case, whether only photon detection or also demodulation capability are required, the dendritic gate pixels can be arranged in one or two dimensions, resulting in line sensors or area image sensors. Each of the pixels of such an image sensor must be provided with at least the following set of electrical connections:

Power-supply voltage and ground lines.
One input-voltage line for each of the contacts of the electrode that are switched synchronously with the modulation frequency or set to constant voltage level during the integration period, depending on the mode of operation (static or dynamic).
One reset-signal line for resetting the electronic charge-detection circuit after the signals have been read out and a new exposure and charge accumulation period starts.
One pixel-selection line that allows the selection of the pixels whose signals should be read out and/or reset.
One output-signal line for each charge detection circuit that is connected with the corresponding charge-storage diffusion. The pixel-selection line connects the output-signal lines to one or several busses that are common to several pixels, typically to a complete column. Alternatively, fewer bus lines than diffusion signals can be used, requiring a demultiplexing circuit that can distribute these signals on the available busses. This makes it necessary to provide each pixel with the appropriate lines for controlling the demultiplexing circuit.

Additionally, one pixel can be equipped with various processing units, which are typical for CMOS smart sensors. As an example, this can be an in-pixel analog-to-digital conversion, a spatial pixel-convolution circuit, a correlated double-sampling stage to eliminate reset noise, circuits to increase the dynamic range (reset counter, pixel-wise control of the integration time, logarithmic readout, etc.), processing circuits (subtraction of two signal values, etc.) or other analog or digital functionality.

The novel pixel structure according to the present invention can be realized with industry standard CMOS or CCD processes. Small modifications of the processes lead to more flexibility in combining materials with different resistivities. In particular, the gate materials do not have to be made necessarily of poly-silicon, although this material is preferred as it is generally available in conventional CCD or CMOS processes. Other materials such as thin metal provide an alternative to poly-silicon. The charge-transfer efficiency performance in the semiconductor material just below two minimally spaced gate structures enormously benefits from technology scaling. The smaller the allowed geometrical spacing, the better the linearity of the potential distribution.

The dendritic gate pixel transports the charge below the gate at the semiconductor surface in the direction of highest electric potential gradient. However, the transport at the semiconductor surface implies trapping effects and the charge transport may be relatively slow and inefficient due to crystal defects at the semiconductor-insulator interface. In this case, the transport process can be improved by displacing the transport region deeper into the bulk of the semiconductor. The method is known from buried-channel CCDs, and it is described by A. J. P. Theuwissen in "Solid-state imaging with charge-coupled devices", Kluwer, Dordrecht, 1995. A further advantage of the charge transport deeply in the bulk material is the higher sensitivity of the pixel to long optical wavelengths, i.e., to the infrared region of the electromagnetic spectrum. This is because photons of long wavelengths penetrate much deeper into the semiconductor material than short-wavelength photons—following the law of Lambert. If the transport region is displaced into the bulk, the photo-generated charge carriers stemming from photons of long optical wavelengths efficiently feel the electric drift fields into the direction of the sensing node instead of diffusing in the bulk area, partially recombining and causing loss of intensity information. The displacement of the transport region deeper into the bulk is achieved by fabricating an area of the opposite doping type of the semiconductor at the surface and by completely depleting this area with a suitable voltage. In this way, the transported charge carriers are majority charge carriers, but since they move in the bulk of a completely depleted semiconductor, they benefit from very efficient transport properties and negligible losses. Typical depth values for this buried transportation channel are between 10 nm and 1000 nm.

Another improvement of transport of photo-generated charges in the semiconductor can be achieved by the technique of shallow-buried channel (Lattes, Munroe, Seaver: "Ultrafast shallow-buried-channel CCDs with built-in drift fields", IEEE Electr. Dev. Letters, Vol. 12, No. 3, March 1991). Several side-by-side buried-channel implantations with different doping concentrations are applied so that built-in drift fields are exploited for the high-speed and efficient charge transport. This technology is very useful in particular for static mode operations, where the charge transport does not change the direction with time.

The shape of the complete sensitive (or active) area (or region) is arbitrary, although in many applications rectangular or hexagonal shapes are preferred, as shown further below.

There exist various applications for dendritic gate structures, in particular photo-sensing applications such as:
Conventional intensity imaging, preferably with static pixel operation.

Time-dependent measurements as time-of-flight distance measurements, based on dynamic pixel operation High-performance CMOS imaging with regards to low cost, high speed and high photo sensitivity, whereby the pixel can be operated either in static or in dynamic mode depending on the particular application.

BRIEF DESCRIPTION OF THE DRAWINGS

Embodiments of the invention are described in greater detail hereinafter relative to the attached schematic drawings.

FIGS. 1 and 2 show (a) desired two-dimensional electric field distributions and (b) top views of combined low- and high-resistive gate structures realizing the electric field distributions.

FIG. 3 shows (a) a top view of a combined low- and high-resistive gate structure and (b), (c) two cross-sections through the gate structure along the lines IIIb-IIIb and IIIc-IIIc, respectively, together with the corresponding lateral potential distributions.

FIG. 4 shows top views of snake-like dendritic gate structures consisting of (a) only high-resistive material and (b) both high- and low-resistive materials.

FIG. 8 shows a schematic top view of a four-tap pixel structure combining two two-tap dendritic gate structures.

FIG. 9 shows (a) a top view of a perforated dendritic gate structure consisting of only high-resistive material, with four contacts, and (b) a simulation result of its potential distribution.

DESCRIPTION OF PREFERRED EMBODIMENTS

Figure 6A:
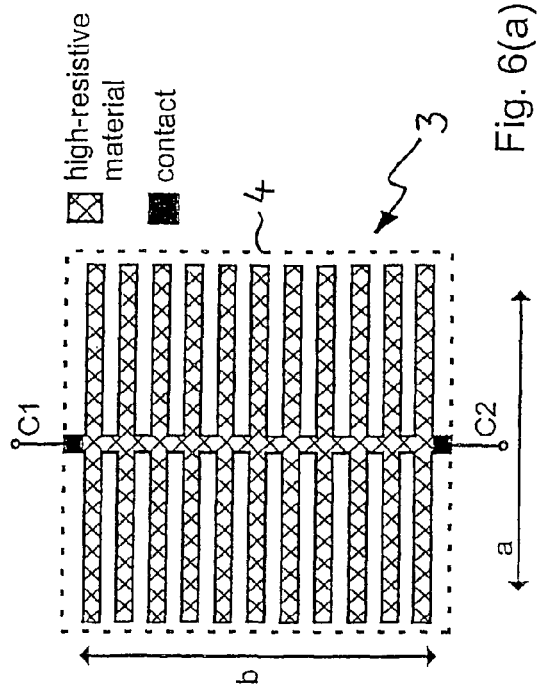
FIG. 6 shows top views of tree-like dendritic gate structures (a) consisting of only high-resistive material, (b) consisting of both high- and low-resistive materials and (c) with a diagonal design.

Cross-sections through an embodiment of the pixel according to the invention are shown in FIGS. 3(b) and 3(c). The new pixel architecture makes use of a semiconductor substrate 1, such as a silicon substrate, for the conversion of incident radiation In into electron-hole pairs. Without loss of generality, one can assume in the following that this semiconductor material 1 is p-doped and that one wants to detect electrons as minority charge carriers in the semiconductor material 1. All subsequent arguments can be suitably modified to hold true for the detection of photo-generated holes as minority carriers in n-doped semiconductor material. The semiconductor substrate 1 is covered with a transparent insulating layer 2, preferably an oxide, as available in industry standard CMOS processes. The oxide-layer thickness is chosen in the range of 1 nm to 500 nm, according to the specifications of the selected semiconductor process, in order to transfer a large part of the electric surface fields into the semiconductor material 1, while maintaining robust processing and high fabrication yields without shorts in the gate. On top of the oxide layer 2, a gate structure 3 (see FIG. 3(a)) with application-specific geometry (of dendritic or arborescent shape in general) is arranged, made from one material or a composition of various materials 31, 32. The gate material 31, 32 should be transparent for the incident radiation In, for example fabricated from doped polysilicon, and/or it should have openings so that the incident radiation In can be transmitted into the bulk of the semiconductor substrate 1.

Alternatively, it is possible to thin the semiconductor substrate 1 to a small thickness and to let the radiation impinge from the back of the device, as in so-called back-illuminated photodetectors. In this case, the insulating layer 2 and the gate material 31, 32 do not necessarily have to be transparent for the incident radiation In. The thickness of the semiconductor substrate 1 is chosen so small that a sufficiently high portion of the incident radiation In is transmitted through the semiconductor substrate 1. It is not possible to give a general absolute value for a "maximum thickness" that fulfills this condition, since such a value depends on the wavelength of the incident radiation In, the absorption coefficient of the semiconductor material 1, the conversion efficiency of the semiconductor material 1 and other parameters. However, the person skilled in the art is able to determine such a thickness for a given configuration. To give an example, substrate thicknesses of several micrometers may be suitable for certain applications.

The architecture of the dendritic gate 3 according to the invention allows the creation of any arbitrarily chosen two-dimensional distribution of the electric field in the gate 3 and in the semiconductor material 1, respectively. A very simple example of the realization of a particular electric field distribution is depicted in FIG. 1. FIG. 1(a) shows a desired two-dimensional electric field distribution, and FIG. 1(b) shows a combined low- and high-resistive gate structure 3 realizing the electric field distribution of FIG. 1(a). Such a two-dimensional arrangement of high- and low-resistive gate materials 31, 32 generates a two-dimensional electric field distribution varying in magnitude and direction. Throughout this document, the borderline between a "low-resistive material" 32 and a "high-resistive material" 31 is understood to lie at a sheet resistance of approximately 10 Ohms per square. Thus, high-resistive materials 31 are such with a sheet resistance higher than $10\Omega/\square$, and preferably more than $10\,k\Omega/\square$, e.g., many tens of $k\Omega/\square$, and up to about $1\,M\Omega/\square$.

In this case, the combination of high- and low-resistive materials 31, 32 in the gate 3 is the fundamental tool for the generation of a desired electric field distribution due to a current flow through the gate 3 itself. Typically, whenever a specific two-dimensional electric field distribution is required, the topology of the corresponding gate structure 3 is of two-dimensional nature, too.

The dendritic gate 3 itself is contacted at its periphery with at least two (or more) contacts C1, C2 that are connected to static or switchable voltage sources, depending on the operation mode. Between the contacts C1, C2 there is at least one connection of high-resistive gate material 31. The current flowing through the dendritic gate structure 3 produces the two-dimensional potential distribution shown in FIG. 1(a), which is essentially reproduced at the surface of the semiconductor material 1 at the same time.

Close to at least one contact C1, C2 at the periphery of the gate structure 3, a diffusion region D1, D2 of the opposite conductance type as the silicon bulk material 1 is created (cf.

Figure 6C:
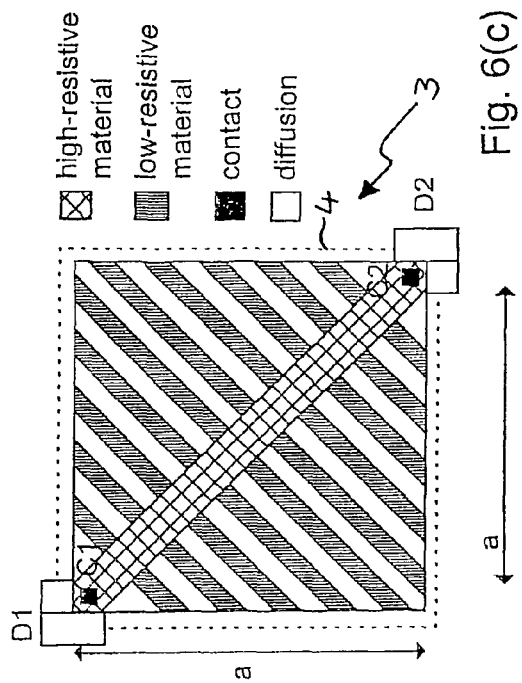

FIG. 6(c)). Since these diffusions D1, D2 have the task of collecting and accumulating the minority photo-charge carriers, they must be biased at a higher potential than the corresponding gate contacts C1, C2. The collected photo-charge carriers on the diffusions D1, D2 can be read out by known electronic circuits such as illustrated in FIG. 11. Instead of diffusion region D1, D2 close to the contact C1, C2, one can implement an integration gate with an adjacent transfer gate and a diffusion region as sensing node, as is typically used in CCD techniques.

If the semiconductor material 1 is kept at ground potential and the contact voltages are positive, the silicon-insulator interface is kept in inversion such that the photo-generated charge carriers can be collected and transported to the readout structure. According to the potential distribution within the dendritic gate structure 3, the same distribution is created at the silicon-insulator interface and forces the photo-generated charge carriers to move into the direction of lower potential energy. The photo-charge carriers are finally stored in the corresponding integration (or accumulation) area, which can be a diffusion region D1, D2 or an integration gate as mentioned above.

The realization of the pixel gate 3 for the creation of an application-specific two-dimensional electric field distribution in the gate 3 and in the semiconductor material 1, respectively, additionally showing high-performance regarding the photo-sensitivity and power dissipation, can be performed, according to the invention, by one or several of the following three means:

(i) The gate 3 is of non-rectangular, generally dendritic shape, whereby the process-dependent minimal width and spacing values determine the design limitations of the fineness of the arborescence. The narrower and longer the arborescent structures 3, the lower the power dissipation of the pixel.

(ii) The topology of the gate structure 3 is two-dimensional and not one-dimensional.

(iii) One or more gate materials 31, 32 with possibly different resistivities and optical transparencies are employed for the realization of the dendritic-gate pixel.

An example of the incorporation of all three aspects is shown in FIG. 2. In analogy to FIG. 1, FIG. 2(a) shows a desired two-dimensional electric field distribution, and FIG. 2(b) shows a combined low- and high-resistive gate structure 3 realizing the electric field distribution of FIG. 2(a). The suitable arrangement of an arborescent gate structure 3 and the utilization of both high- and low-resistive materials 31, 32 allow for the generation of two opposite circular electric fields with spatially dependent magnitude. Further requirements for high-performance pixel structures such as low-power consumption, high quantum efficiency and high sensitivity are ensured. The example of FIG. 2 shows that the gate structure 3 does not necessarily have to consist of one continuous area, but may comprise a plurality of separate areas. In this embodiment, the gate structure 3 consists of an outer ring and an inner ring which are connected by electrical contacts C1, C2.

The combination of differently resistive gate materials 31, 32 in one dendritic gate structure 3 allows the optimal adjustment of the potential distribution in the gate 3 over a two-dimensional area. In particular, the suitable combination of differently resistive materials 31, 32 within the gate structure 3 controls the electric field in both directions and for spatially dependent magnitudes. In addition, the photo-sensitivity and quantum efficiency can be increased, while significantly reducing the power consumption of the pixel. This is because the fragmental opening of the gate allows more photons to reach the space charge region where they are detectable, so that the quantum efficiency is increased extensively compared to conventional MOS devices. If the spaces and widths of the structure are small enough, an almost linear potential distribution across the gate structure 3 can be maintained (see FIG. 3(c)). Otherwise, areas of diffusion as the dominating charge transport process in the semiconductor 1 can be defined, alternating with areas in which photo charges are moved by electric drift fields.

FIG. 3 shows an embodiment with an approximately constant drift field at the semiconductor-insulator interface. A top view of the harp-like embodiment is illustrated in FIG. 3(a). FIG. 3(b) shows a cross section through the dendritic gate structure 3 with continuous high-resistive gate material 31 above the oxide layer 2. Due to the small current flow through the gate 3 a linear potential distribution is expected. The second cross section shown in FIG. 3(c) refers to low-resistive finger gates 32 tapping the voltages of the high-resistive rail 31 at specific points. As the widths and spacing of the gate elements are minimal according to the available technology, the potential distribution behaves similarly to FIG. 3(b), and it is almost linear. The quasi-constant drift field below the complete gate structure 3 allows a very fast transport of the photo-generated electrons.

The harp-like dendritic gate 3 of FIG. 3 is only one example of the dendritic design. A large number of design variations are possible. The most preferred ones are discussed below.

For the acquisition of pure reflectance images, in particular if high detection sensitivity and low electronic charge readout noise are required, dendritic gate structures are preferred that contain two gate contacts but only one sensing diffusion beside one of the gate contacts. The drift field below the dendritic gate points to the direction of the sensing diffusion. By applying two different constant voltages to the gate contacts of a desirable gate structure, the specific drift field is generated. As the charge transport is based on the fast drift phenomenon instead of the much slower diffusion process as indicated in FIG. 3, large photosensitive areas and high frame rates are possible. The structures of FIGS. 4, 6 and 7 are preferred for that usage.

The snake-like structure of the dendritic gate 3 of FIG. 4(a) consists of high-resistive material 31 only. The high-resistive gate material 31 is as long and as narrow as allowed by the particular process. The complete active area 4 is filled by the gate structure 3 to increase the resistivity. Thus, this gate structure 3 has the highest possible electrical resistivity, and the power consumption is the lowest achievable. The resulting resistivity of the gate structure 3 is approximately given by $$R_{1a} = R_{HR} * [b + (b*a)/(w_{minwidth} + w_{minspace})]/w_{minwidth},$$

where $R_{HR}$ is the specific resistivity of the high-resistive gate material 31, $w_{minwidth}$ is the minimal width of a gate connection line and $w_{minspace}$ is the minimal spacing between two gate lines. A possible disadvantage of this particular embodiment of a dendritic gate 3 is a non-uniform potential distribution with regard to a cross section from top to bottom.

To reduce this problem, a second dendritic gate structure 3 in snake form is proposed as depicted in FIG. 4(b). This snake-like structure 3 combines high-resistive and low-resistive gate materials 31, 32. It has a smaller resistivity but a higher response frequency due to its smaller RC time constant. The combination of high-resistive material 31 with low-resistive material 32 leads to a controlled uniform potential distribution. However, the reduced resistivity of approximately $$R_{1b} = R_{HR} * b/w_{minwidth}$$

compared with the structure of FIG. 4(a) has to be compensated. The equations assume no ohmic losses in the low-resistive gate material 32. The ratio between $R_{1a}$ and $R_{1b}$ is given by $$R_{1a}/R_{1b} = (w_{minwidth} + w_{minspace} + a)/(w_{minwidth} + w_{minspace}).$$

The last equation shows that the resistivities of the two dendritic snake-like gate structures 3 of FIGS. 4(a) and 4(b) are similar for small pixel sizes a, but for large sizes a the resistivity of the gate 3 in FIG. 4(a) is larger by a factor of about $$a/(w_{minwidth} + w_{minspace})$$

than that of the gate 3 in FIG. 4(b).

The gain in power-consumption reduction of the pixel compared to a gate structure that is not arborescent and consists of a uniform high-resistive gate ($R=R_{HR}*(b/a)$) is in the case of FIG. 4(a)

$$[a+a^2/(w_{minwidth}+w_{minspace})]/w_{minwidth}$$

and in the case of FIG. 4(b)

$$a/w_{minwidth}.$$

Figure 5:
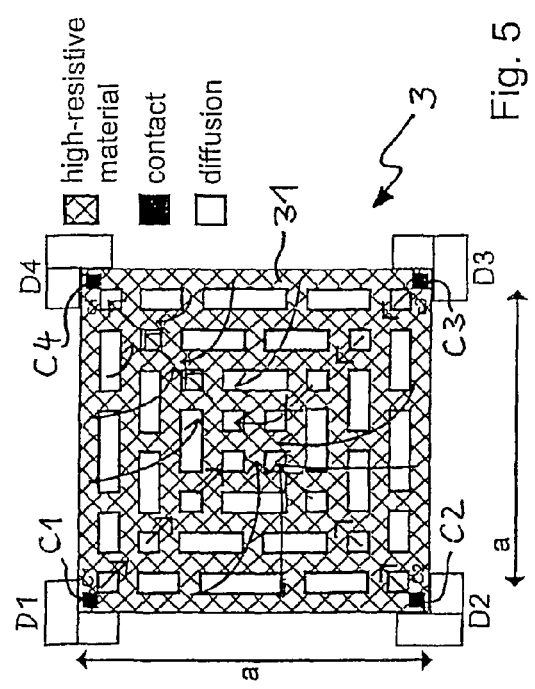
FIG. 5 shows a top view of a perforated dendritic gate structure consisting of only high-resistive material.

FIG. 5 shows a two-dimensional dendritic gate structure 3 with sub-area control of the drift field based exclusively on the utilization of high-resistive material 31 and additional fragmentations. The example shows a high-resistive photo gate 3 repeatedly perforated with different gap widths. The structure has four gate contacts C1-C4 and four diffusions D1-D4 assigned to the respective contacts C1-C4, and hence can be used for static and dynamic mode operation. In order to illustrate the control of the drift field by choosing appropriate gap shapes, a particular case is shown, in which contacts C1 to C3 are set to a low potential and contact C4 is set to a high potential. The electric field components are just outlined. Due to the adjustment of the size of fragmentations in each quarter the field components between two adjacent contacts C1, C2 are primarily oriented to the center, while the fields between two opposite contacts C1, C3 are almost constant and are arranged parallel to the diagonal axis.

Figure 6B:
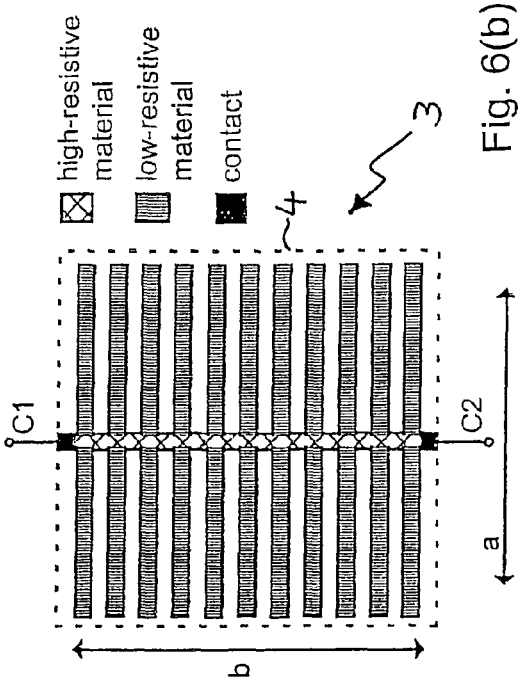

A dendritic gate 3 in a "tree" form is illustrated in FIG. 6. The combination of high-resistive material 31 with low-resistive gate components 32 allows a well-controlled adjustment of the cut-off frequency or RC time constant, respectively. FIGS. 6(a) and 6(b) represent two examples of "tree" structures 3 with highest and lowest RC time constant, respectively. Between these cases, structures with finger gates are imaginable that are partially composed of high-resistive and low-resistive materials 31, 32. FIG. 6(c) is an equivalent design in diagonal alignment with a very high collection and transport efficiency of photo-generated charge carriers, since the electric field lines are focused to the specific corner of highest potential energy.

Figure 7A:
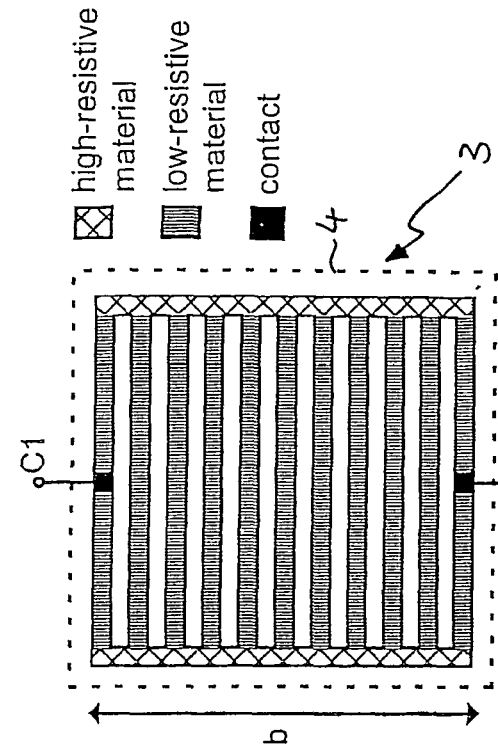
FIG. 7 shows top views of dendritic gate structures (a) with a harp-like form, consisting of only high-resistive material, (b) with a harp-like form, consisting of both high- and low-resistive materials, (c) with a comb-like form, consisting of only high-resistive material, (d) with a comb-like form, consisting of both high- and low-resistive materials.
Figure 7B:
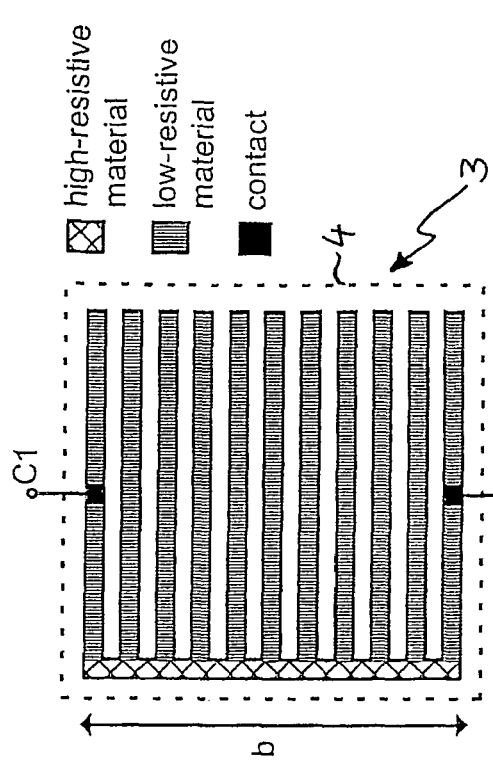
Figure 7C:
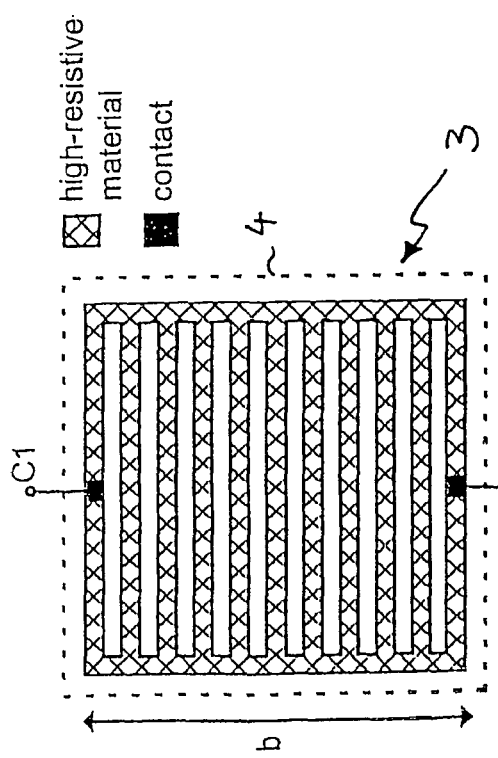
Figure 7D:
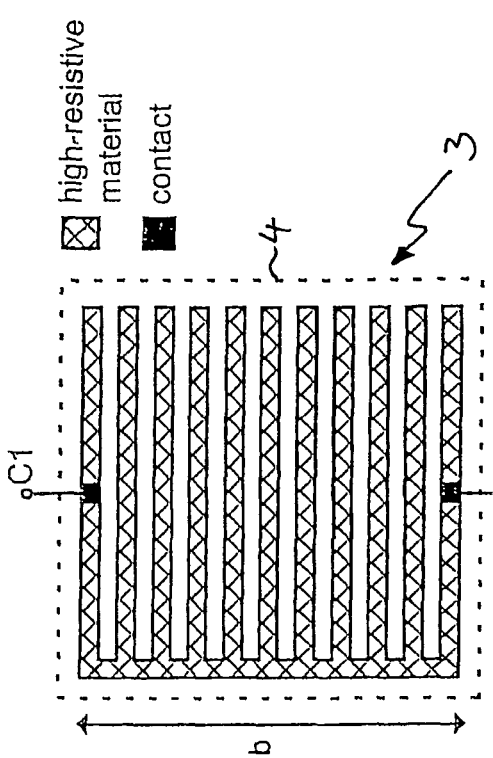
Figure 10A:
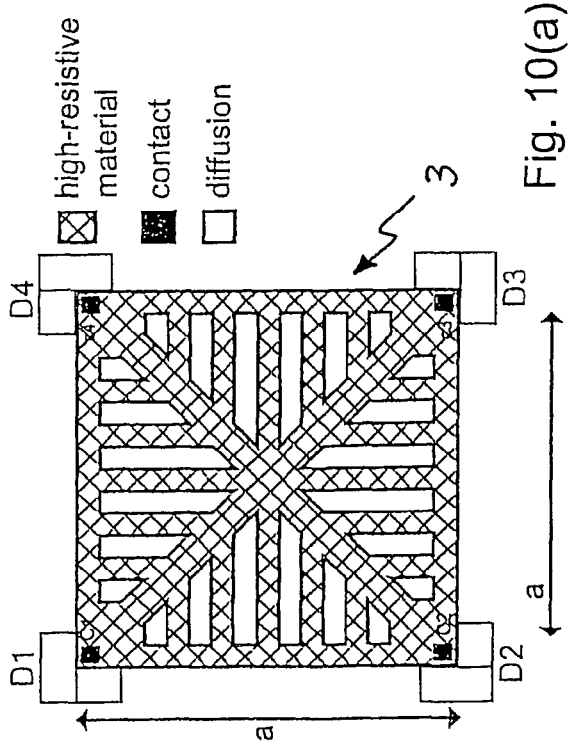
FIG. 10 shows top views of ice-crystal-like dendritic gate structures with four contacts, consisting of (a)-(d) only high-resistive material and (e) both high- and low-resistive materials.
Figure 10B:
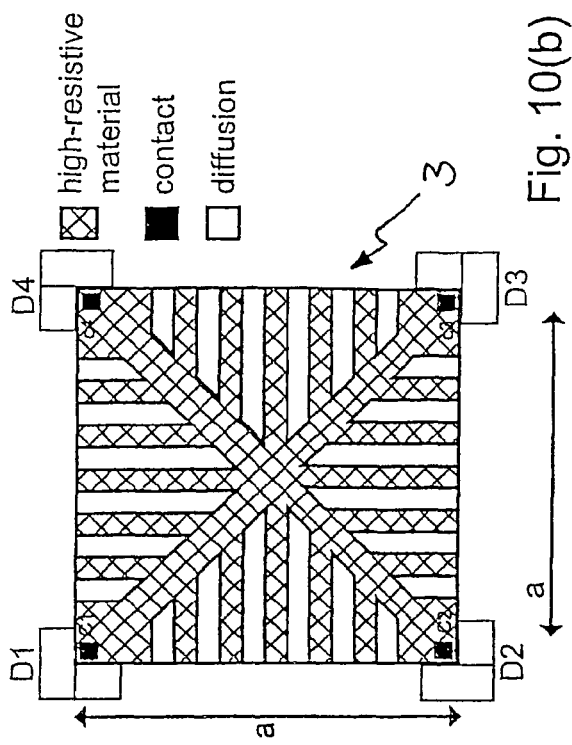
Figure 10C:
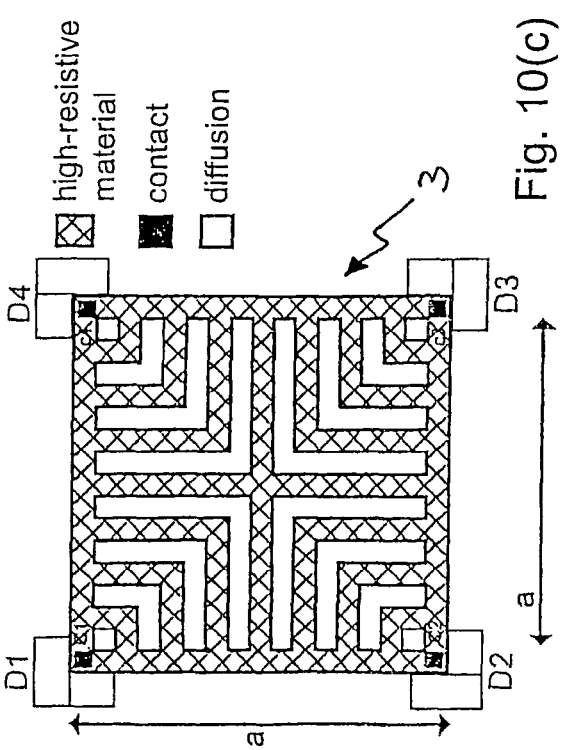
Figure 10D:
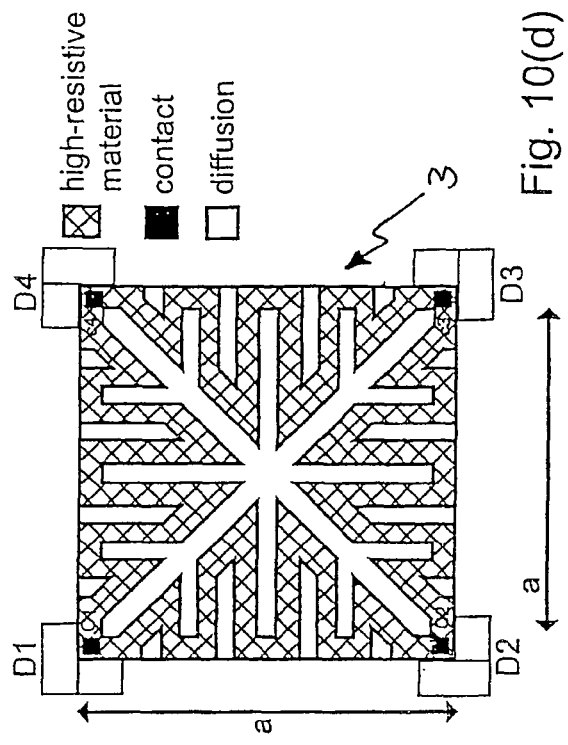

FIG. 7 shows dendritic gate structures 3 with harp-like forms (FIGS. 7(a), 7(b)) or comb-like forms (FIGS. 7(c), 7(d)) with different combinations of high- and low-resistive gate components 31, 32.

The four-tap pixel structure of FIG. 8 combines two two-tap dendritic gate structures 3.1, 3.2, i.e., comprises two photosensitive regions 4.1, 4.2. (Tap stands for storage node, e.g. a four-tap pixel consists of four storage nodes.) The use of such a pseudo four-tap structure is found particularly in high-resolution three-dimensional imaging. A scene to be imaged is illuminated with light modulated with a constant frequency, defining a time period. For detection, the time period is divided into four time intervals. For each time interval, a different voltage configuration is generated at the contacts C1-C4 (cf. FIG. 9(b)). Each of the four taps is used to accumulate photo-charges generated in time intervals corresponding to phase shifts of 0°, 90°, 180° and 270°, respectively. In order to avoid spatial distortions due to the use of two spatially separated photosensitive areas 4.1, 4.2, a spatial averaging of the incident light In by microlenses or other optical elements or a dendritic gate pixel designed as four-tap structure might be preferable.

FIG. 9(a) shows a dendritic gate pixel based on high-resistive gate 3, and FIG. 9(b) a simulation result of its potential distribution for the case that constant voltages are set to the contacts C1-C4. Contacts C1, C3 and C4 are set to ground, whereas contact C2 is set to any high potential. When using the pixel for a time-of-flight distance measurement, the voltages are changed among the four contacts C1-C4 synchronously with the modulation frequency, so that the depicted potential distribution rotates with the modulation frequency.

In FIG. 10, various embodiments of four-tap pixels with different ice-crystal-like dendritic gate structures 3 composed of both high- and low-resistive materials 31, 32 are shown. FIGS. 10(c), 10(d) and 10(e) correspond to the two-tap snake structures of FIG. 4. They exhibit the largest possible electrical resistivity, and the potential drop is effectuated along the narrowest and simultaneously longest possible gate connection between the contacts C1-C4.

Figure 11B:
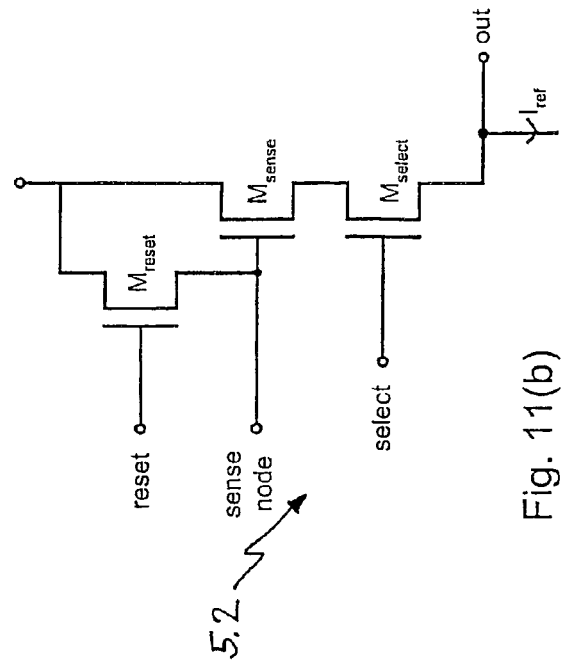
FIG. 11 shows two readout-circuit examples for the pixel according to the invention: (a) a charge-integration circuit with a Miller integrator and (b) an active-pixel-sensor circuit.
Figure 10E:
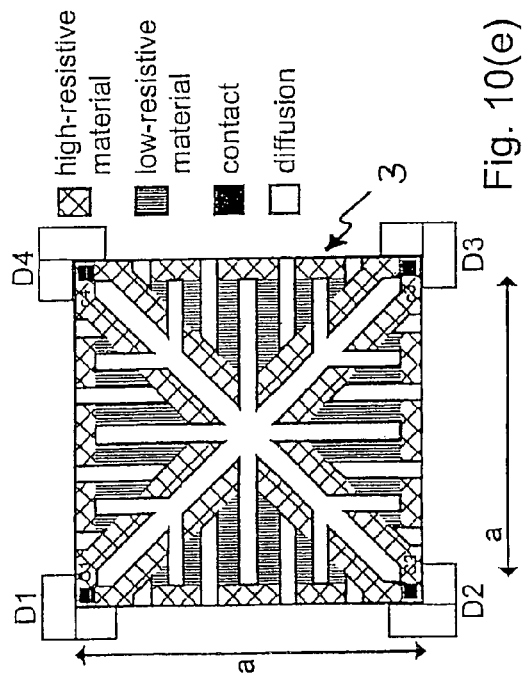
Figure 11A:
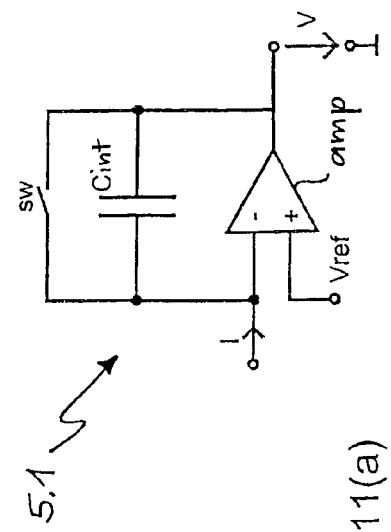

Examples of readout circuits 5.1, 5.2 for the diffusions D1-D4 of the pixel according to the invention, in which photo-generated charge carriers are collected and accumulated, are given in FIG. 11. In the charge-integration circuit 5.1 of FIG. 11(a), charge integration is performed by a Miller integrator. A photocurrent I originating from a diffusion D1 of the pixel is integrated on a capacitor Cint. As the input terminals of an amplifier amp are held at a reference potential Vref, the integration of the photo-charges is performed without non-linearity effects due to a voltage dependent capacitance value in the sensing diffusion D1. The integration process can be reset and started from zero by closing a switch sw.

FIG. 11(b) shows an active-pixel-sensor circuit 5.2 comprising three transistors Mreset, Mselect, Msense. A reset transistor Mreset allows the reset of the sensing diffusion D1 of the pixel. A select transistor Mselect is switched on when the particular pixel should be read out on a readout line out. The source voltage of a sensing transistor Msense loaded with a reference current Iref is directly proportional to the voltage of the sensing diffusion D1 since the transistor Msense operates in saturation; this circuit configuration is also known as a source-follower circuit.

The gate structures 3 with four contacts C1-C4 as depicted in FIGS. 5, 9(a) and 10 can be used for large-area imaging so that two-dimensional spatial varying electric fields are exploited for the fast transport of photo-generated charges. Although the pixels are illustrated with four diffusion areas D1-D4 beside the gate contacts C1-C4, large-area sensing with static pixel operation requires only one sensing diffusion site for the detection of the incident light wave In.

The following discussion of preferred embodiments of the invention is related to time-of-flight distance measurements. However, the dendritic gate pixel is not limited to only this kind of demodulation application; other time-dependent measurements are possible.

The dynamic operation of the pixel is useful if two or more sensing nodes D1-D4 and gate contacts C1-C4 have been implemented such that a time-dependent potential distribution can be generated by changing the voltages at the contacts C1-C4. As a consequence, the gate contacts C1-C4 and the signals at the sensing nodes D1-D4 are related to a specific duration of integration of the incident light wave In. If a sinusoidally modulated wave field In is detected, demodulation can be achieved in each pixel applying an appropriate clocking scheme of the gate contacts C1-C4. The basic principle of demodulation and extraction of the modulation parameters have already been described above. Basically, three different methods are known for the realization of in-pixel phase measurement:

A. The first method is based on so-called two-tap structures, which are pixels with only two sensing nodes D1, D2. The dendritic gate pixels in FIGS. 4, 6 and 7 represent such two-tap structures. (In some figures there are no diffusion areas designed, but this is only to provide for better legibility and not to limit the design of the pixel in any way.) The gate contacts C1, C2 are switched in such a manner that the electric field changes its direction twice during one modulation period. The accumulated charge carriers in each sensing-diffusion site D1, D2 generate a voltage swing inversely proportional to the effective capacitance of the diffusion site D1, D2. The signals correspond to the in-phase samples of the modulation signal, whereby the phase difference between the samples is half of the modulation period. A second measurement with a signal on the gate contacts C1, C2 shifted by a quarter of the modulation period has to be done in order to obtain the quadrature samples. Based on these four samples the modulation parameters and hence the distance information can be extracted. A disadvantage of this demodulation method is the requirement of two subsequent measurements, which are shifted in time and hence may produce time-related artifacts.

B. A second method of sampling the incident light wave In using the present invention is the combination of two two-tap structures 3.1, 3.2 as schematically indicated in FIG. 8. Providing each two-tap structure 3.1, 3.2 with a sampling signal at the gate electrodes, whereby the two signals are phase-shifted by a quarter of the modulation period, results in four samples simultaneously. However, this technique has the main disadvantage of spatial distortions due to the separation of the photosensitive area into two separate regions 4.1, 4.2. To overcome this problem, microlenses have to be used for spatial distribution and averaging before the detection in the pixel. However a more convenient solution to this problem is a structure with only one sensitive area, providing simultaneously four samples, i.e., a four-tap structure. Such a four-tap structure can be implemented very easily with a dendritic gate structure.

C. The demodulation process with four-tap structures is the third possible method. Some exemplified gate structures 3 are shown in FIGS. 5, 9(a) and 10, whereby the structures 3 originate different potential distributions. They all have the aim of creating a suitable potential distribution, forcing the photo-generated charge carriers to drift to one single sensing-diffusion site at a time. Depending on the details of the arborescent structure of the gate 3, the electronic characteristics of the pixel may vary with regard to cut-off frequency, power consumption and potential distribution below the gate 3. FIG. 9(b) shows the potential distribution of the corresponding dendritic gate in FIG. 9(a). This simulation result corresponds to a voltage set of three contacts C1, C3, C4 at a low potential and one contact C2 at a high potential. Other voltage combinations are possible. In particular, the combination of three different levels (high, low and intermediate) is preferred for the demodulation. Table I indicates the preferred driving of the four gate contacts C1-C4. This example refers to the clock voltage sequence of a demodulation device with four storage sites D1-D4 and four electrode contacts C1-C4 with voltages V1, V2, V3 and V4. H indicates a high voltage level, L indicates a low voltage level, and I indicates an intermediate voltage level between H and L. Each period T of the demodulation timing is separated into four equal quarters: T0, T1, T2 and T3.

TABLE I

|  | V1 | V2 | V3 | V4 |
|---|---|---|---|---|
| T0 | H | I | L | I |
| T1 | I | H | I | L |
| T2 | L | I | H | I |
| T3 | I | L | I | H |

The dendritic gate pixel can also consist of a gate electrode with two or more contacts C1-C4 and several diffusion regions D1-D4 as mentioned above, where the number m of diffusion regions does not exceed the number n of gate contacts (m≦n). In the case of one gate electrode 3 with n contacts C1-Cn and n corresponding diffusions D1-Dn (i.e., an n-tap demodulation pixel), it is possible to detect and demodulate incident modulated wave fields In whose modulation waveform is described with n parameters. An example of such a demodulation problem is a waveform that consists of a linear combination of n/2 sine signals, each having its proper amplitude and n/2 cosine signals, each having its proper amplitude. An n-tap demodulation pixel collects all the signals that are necessary for a demodulation operation that is mathematically carried out by a discrete Fourier transform, as explained for example in D. W. Kammler, "A First Course in Fourier Analysis", Prentice Hall, N.J., 2000.

This invention is not limited to the preferred embodiments described above, to which variations and improvements may be made, without departing from the scope of protection of the present patent.

LIST OF REFERENCE SIGNS

| | |
|---|---|
| 1 | Semiconductor substrate |
| 2 | Insulator layer |
| 3 | Gate electrode |
| 31 | High-resistive material |
| 32 | Low-resistive material |
| 4 | Active region |
| 5 | Readout circuit |
| a, b | Length and width of the active region |
| amp | Amplifier |
| C | Electrode contact |
| Cint | Integration capacitor |
| D | Accumulation diffusion |
| I | Photocurrent |
| Iref | Reference current |
| Mreset | Reset transistor |
| Mselect | Select transistor |
| Msense | Sensing transistor |
| out | Output-signal line |
| reset | Reset-signal line |
| select | Pixel-selection line |
| sense node | Sense-node line |
| sw | Switch |
| T | Period of modulation frequency |
| U, V | Electric voltage |
| Vref | Reference potential |

The invention claimed is:

1. A pixel formed in a semiconductor substrate with a plane surface for use in an image sensor, comprising:

an active region for converting incident radiation into charge carriers of a first and a second charge type, separating the charge carriers of the first charge type from the charge carriers of the second charge type and accumulating charge carriers of at least one charge type, and a detection region for electronically detecting the accumulated charge carriers, the detection region being geometrically and electrically separated from the active region, the active region having field-generating structure for generating a lateral electric drift field at the semiconductor surface in the active region, the field-generating structure comprising a resistive electrode layer isolated from the semiconductor substrate and at least two connections for applying an electric potential difference along the electrode layer, wherein the electrode layer has a dendritic or arborescent shape.

2. The pixel according to claim 1, wherein the width and/or spacing of the dendritic or arborescent structure are at or close to a lower limit given by the manufacturing process applied.

3. The pixel according to claim 1, wherein the shape of the electrode layer or its complementary shape is harp-like, comb-like, tree-like, snake-like, ice-crystal-like, or is a perforated plane.

4. The pixel according to claim 1, wherein the electrode layer comprises a first material with a sheet resistance higher than 10 Ω/□.

5. The pixel according to claim 4, wherein the electrode layer further comprises a second material with a sheet resistance lower than 10 Ω/□.

6. The pixel according to claim 4, wherein the electrode layer comprises polysilicon or metal.

7. The pixel according to claim 1, wherein the semiconductor substrate is a silicon substrate.

8. The pixel according to claim 1, wherein an insulating layer is arranged between the semiconductor substrate and the electrode layer.

9. The pixel according to claim 8, wherein the insulating layer has a thickness between 1 nm and 500 nm.

10. The pixel according to claim 1, wherein at least one diffusion well or integration gate for accumulating charge carriers is provided at an edge of the electrode layer close to at least one of the connections for applying an electric potential difference.

11. The pixel according to claim 1, wherein a buried channel in the bulk of the semiconductor substrate is provided in the active region for separating and transporting the charge carriers.

12. The pixel according to claim 1, wherein the detection region comprises an electronic circuit for reading out the accumulated charge carriers.

13. The pixel according to claim 1, wherein the semiconductor substrate has a thickness so small that a sufficiently high portion of the incident radiation is transmitted through the semiconductor substrate.

14. The pixel according to claim 1, wherein the pixel has been manufactured with a CMOS or a CCD process.

15. An image sensor comprising a plurality of pixels arranged in a one- or two-dimensional array,
characterized in that
the pixels are pixels according to claim 1.

16. The image sensor according to claim 15, wherein each pixel is at least provided with
two connections for power supply,
at least two input voltage lines for applying an electric potential difference along the resistive electrode layer,
a reset-signal line,
a pixel-selection line, and
an output-signal line.

17. A method for sensing incident radiation, comprising:
converting the incident radiation into charge carriers of a first and a second charge type in an active region of a pixel formed in a semiconductor substrate with a plane surface,
generating a lateral electric drift field at the semiconductor surface in the active region,
separating the charge carriers of the first charge type from the charge carriers of the second charge type by means of the drift field and diffusion,
accumulating charge carriers of at least one charge type, and electronically detecting the accumulated charge carriers in a detection region which is geometrically and electrically separated from the active region,
generating the drift field by providing in the active region a resistive electrode layer isolated from the semiconductor substrate, the electrode layer having a dendritic or arborescent shape, and
applying an electric potential difference along the electrode layer.

18. A method for sensing incident radiation modulated with a modulation frequency, comprising:
converting the incident radiation into charge carriers of a first and a second charge type in an active region of a pixel formed in a semiconductor substrate with a plane surface,
generating a lateral electric drift field at the semiconductor surface in the active region,
periodically changing said drift field synchronously with the modulation frequency of the incident radiation,
separating the charge carriers of the first charge type from the charge carriers of the second charge type by means of the drift field,
accumulating charge carriers of at least one charge type, and electronically detecting the accumulated charge carriers in a detection region which is geometrically and electrically separated from the active region,
generating the drift field by providing in the active region a resistive electrode layer isolated from the semiconductor substrate, the electrode layer having a dendritic or arborescent shape, and
applying an electric potential difference along the electrode layer.

19. The method according to claim 18, wherein each period of the modulation frequency is divided into a
predetermined number n of time intervals,
a separate detection region is provided for each time interval, and
charge carriers are accumulated in the corresponding detection region during each time interval.

20. The method according to claim 19, wherein the charge carriers accumulated in the detection regions are detected, and demodulation parameters are calculated from the detected charge carriers.

21. The method according to claim 19, wherein charge carriers are accumulated in the detection regions over more than one period of the modulation frequency before being detected.

22. The pixel according to claim 2, wherein:
the shape of the electrode layer or its complementary shape is harp-like, comb-like, tree-like, snake-like, ice-crystal-like, or is a perforated plane;
the electrode layer comprises a first material with a sheet resistance higher than ten KΩ/□;

the electrode layer further comprises a second material with a sheet resistance lower than 10 Ω/□;
the electrode layer comprises polysilicon or metal;
the semiconductor substrate is a silicon substrate;
an insulating layer is arranged between the semiconductor substrate and the electrode layer;
the insulating layer has a thickness between 1 nm and 500 nm;
at least one diffusion well or integration gate for accumulating charge carriers is provided at an edge of the electrode layer close to at least one of the connections for applying an electric potential difference;
a buried channel in the bulk of the semiconductor substrate is provided in the active region for separating and transporting the charge carriers;
the detection region comprises an electronic circuit for reading out the accumulated charge carriers;
the semiconductor substrate has a thickness so small that a sufficiently high portion of the incident radiation is transmitted through the semiconductor substrate;
the pixel has been manufactured with a CMOS or a CCD process.

23. An image sensor comprising a plurality of pixels arranged in a one- or two-dimensional array,
characterized in that
the pixels are pixels according to claim 22.

24. The image sensor according to claim 23, wherein each pixel is at least provided with
two connections for power supply,
at least two input voltage lines for applying an electric potential difference along the resistive electrode layer,
a reset-signal line,
a pixel-selection line, and
an output-signal line.

25. The method according to claim 20, wherein charge carriers are accumulated in the detection regions over more than one period of the modulation frequency before being detected.

* * * * *